(12) United States Patent
Long et al.

(10) Patent No.: US 10,564,494 B2
(45) Date of Patent: Feb. 18, 2020

(54) ARRAY SUBSTRATE CIRCUIT, ARRAY SUBSTRATE, AND DISPLAY DEVICE

(71) Applicant: BOE Technology Group Co., Ltd., Beijing (CN)

(72) Inventors: Chunping Long, Beijing (CN); Jianbo Xian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 37 days.

(21) Appl. No.: 15/566,610

(22) PCT Filed: Mar. 30, 2017

(86) PCT No.: PCT/CN2017/078820
§ 371 (c)(1),
(2) Date: Oct. 13, 2017

(87) PCT Pub. No.: WO2017/185944
PCT Pub. Date: Nov. 2, 2017

(65) Prior Publication Data
US 2018/0203311 A1  Jul. 19, 2018

(30) Foreign Application Priority Data
Apr. 26, 2016 (CN) .................... 2016 2 0363217 U

(51) Int. Cl.
*G02F 1/1362* (2006.01)
*G02F 1/1345* (2006.01)
(Continued)

(52) U.S. Cl.
CPC .... *G02F 1/136204* (2013.01); *G02F 1/13454* (2013.01); *G09G 3/006* (2013.01);
(Continued)

(58) Field of Classification Search
None
See application file for complete search history.

(56) References Cited

U.S. PATENT DOCUMENTS

2006/0279667 A1* 12/2006 Tsai .................... G02F 1/13454
349/40
2011/0016440 A1* 1/2011 Bergmann .......... G06F 17/5036
716/106
(Continued)

FOREIGN PATENT DOCUMENTS

| CN | 103926761 A | 7/2014 |
| CN | 104021747 A | 9/2014 |

(Continued)

OTHER PUBLICATIONS

Jul. 6, 2017—(WO) International Search Report and Written Opinion Appn PCT/CN2017/078820 with English Tran.

*Primary Examiner* — Ryan Crockett
(74) *Attorney, Agent, or Firm* — Banner & Witcoff, Ltd.

(57) ABSTRACT

An array substrate circuit including an electrostatic discharge circuit for supplying electrostatic discharge to a first signal line for supplying a test signal to the first signal line; wherein, the electrostatic discharge circuit and the test circuit have a shared portion. The array substrate circuit can achieve a lower load of a signal line, and is conducive to achieving a narrow frame panel. An array substrate including the array substrate circuit and a display device are further disclosed.

18 Claims, 8 Drawing Sheets

(51) Int. Cl.
*G09G 3/00* (2006.01)
*G09G 3/36* (2006.01)
*H01L 27/02* (2006.01)
*H01L 27/12* (2006.01)
*H01L 29/49* (2006.01)
*H01L 29/786* (2006.01)

(52) U.S. Cl.
CPC ........... *G09G 3/36* (2013.01); *H01L 27/0251* (2013.01); *H01L 27/1248* (2013.01); *H01L 29/4908* (2013.01); *H01L 29/78675* (2013.01)

(56) References Cited

U.S. PATENT DOCUMENTS

2015/0339959 A1* 11/2015 Li .................. H02H 1/0007
　　　　　　　　　　　　　　　　　　　　　　324/760.01
2016/0240595 A1* 8/2016 Kim .................. H01L 27/3211

FOREIGN PATENT DOCUMENTS

| CN | 205121122 U | 3/2016 |
| CN | 205665504 U | 10/2016 |

* cited by examiner

ARRAY SUBSTRATE CIRCUIT, ARRAY SUBSTRATE, AND DISPLAY DEVICE

The application is a U.S. National Phase Entry of International Application No. PCT/CN2017/078820 filed on Mar. 30, 2017, designating the United States of America and claiming priority to Chinese Patent Application No. 201620363217.3, filed on Apr. 26, 2016. The present application claims priority to and the benefit of the above-identified applications and the above-identified applications are incorporated by reference herein in their entirety.

TECHNICAL FIELD

At least one embodiment of the present disclosure relates to an array substrate circuit, an array substrate, and a display device.

BACKGROUND

In a structural design of a thin film transistor liquid crystal display (TFT-LCD), an array substrate peripheral circuit includes an electrostatic discharge circuit, a gate scan line, a data line, a common electrode line, a repair line and a test line and the like. A high-end display panel generally has characteristics of high resolution and a narrow frame, and there are more peripheral circuits in a peripheral circuit region, so it is easy to form a larger parasitic capacitance load, and easy to lead to various signal delay and poor display. At the same time, a larger circuit area is not conducive to achieving a narrow frame panel.

SUMMARY

At least one embodiment of the present disclosure relates to an array substrate circuit, an array substrate, and a display device, which can achieve at least one of a lower load, reduction of areas of an electrostatic discharge circuit and a test circuit, and design of a narrow frame panel.

At least one embodiment of the present disclosure provides an array substrate circuit, comprising an electrostatic discharge circuit for supplying electrostatic discharge to a first signal line and a test circuit for supplying a test signal to the first signal line; wherein, the electrostatic discharge circuit and the test circuit have a shared portion.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but can include an electrical connection, directly or indirectly. "On," "under," "right," "left" and the like are only used to indicate relative position relationship, and when the position of the object which is described is changed, the relative position relationship can be changed accordingly.

In general, in an array substrate peripheral circuit, an electrostatic discharge circuit for supplying electrostatic discharge to a signal line and a test circuit for supplying a test signal are separately designed, and there is a larger distance between the electrostatic discharge circuit and the test circuit, so a larger frame area is occupied, and the signal line has a larger load.

In embodiments of the present disclosure, a thin film transistor is abbreviated as a TFT. Correspondingly, a first thin film transistor is abbreviated as a first TFT, a second thin film transistor is abbreviated as a second TFT, and a third thin film transistor is abbreviated as a third TFT. In addition, in the embodiments of the present disclosure, a source electrode and a drain electrode are relatively replaceable with each other. For example, in a case where the source electrode is replaced with the drain electrode, the drain electrode is also replaced with the source electrode. In respective drawings, "S" represents the source electrode, and "D" represents the drain electrode.

Figure 1A:
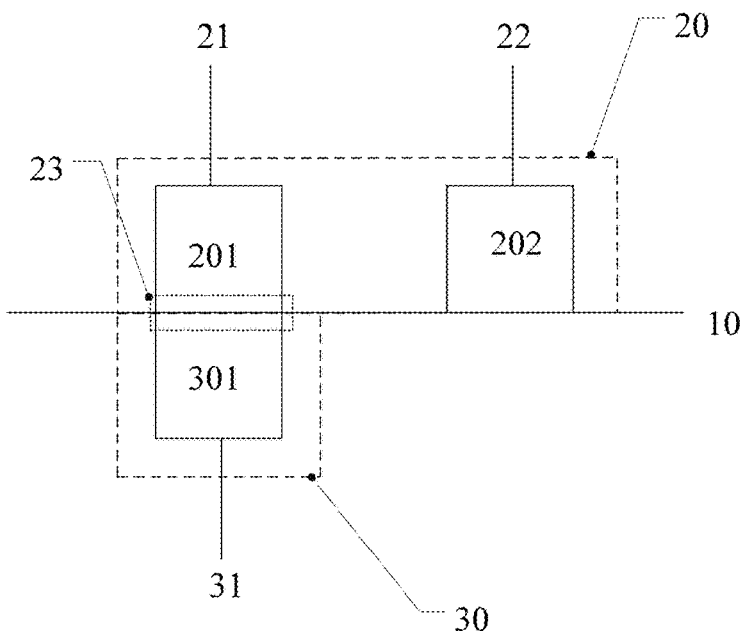
FIG. 1a is a structural schematic diagram of an array substrate circuit (equivalent circuit) provided by an embodiment of the present disclosure.

At least one embodiment of the present disclosure provides an array substrate circuit 123, as illustrated in FIG. 1a, including an electrostatic discharge circuit 20 for supplying electrostatic discharge to a first signal line 10 and a test circuit 30 for supplying a test signal to the first signal line 10, the electrostatic discharge circuit 20 and the test circuit 30 having a shared portion 23. The electrostatic discharge circuit 20 and the test circuit 30 are provided adjacent to each other. For example, in the embodiment of the present disclosure, "shared" refers to that a same element is used both for A purpose and for at least another purpose other than the A purpose. The shared portion refers to that the same element is both in a C part and in a D part, the C part and the D part are two different parts. For example, a same portion of the first signal line 10 is used as a portion of the electrostatic discharge circuit 20 as well as a portion of the test circuit 30.

The array substrate circuit provided by at least one embodiment of the present disclosure has a compact circuit structure, which can achieve a lower load and reduce areas of the electrostatic discharge circuit and the test circuit, and is conducive to achieving narrow frame.

For example, as illustrated in FIG. 1a, the electrostatic discharge circuit 20 includes a first TFT 201 and a second TFT 202, the test circuit 30 includes a third TFT 301, and the shared portion 23 is included in the first TFT 201 and the third TFT 301, or, the shared portion 23 is included in the second TFT 202 and the third TFT 301. That is, the first TFT 201 and the third TFT 301 have the shared portion 23, or, the second TFT 202 and the third TFT 301 have the shared portion 23. For example, the first TFT 201 or the second TFT 202 has the shared portion 23 with the third TFT 301.

It should be noted that, it is illustrated with a case where the first TFT 201 and the third TFT 301 have the shared portion 23 as an example, in FIG. 1a as well as in the embodiment of the present disclosure. However, it can also be that, the second TFT 202 and the third TFT 301 have the shared portion 23. The first TFT or the second TFT according to the embodiment of the present disclosure refers to any one of the TFTs in the electrostatic discharge circuit. In addition, the shared portion is not limited to the cases exemplarily listed. In addition, in the embodiment of the present disclosure, the electrostatic discharge circuit 20 can include other TFTs in addition to the first TFT 201 and the second TFT 202, which will not be limited by the embodiment of the present disclosure.

Figure 1B:
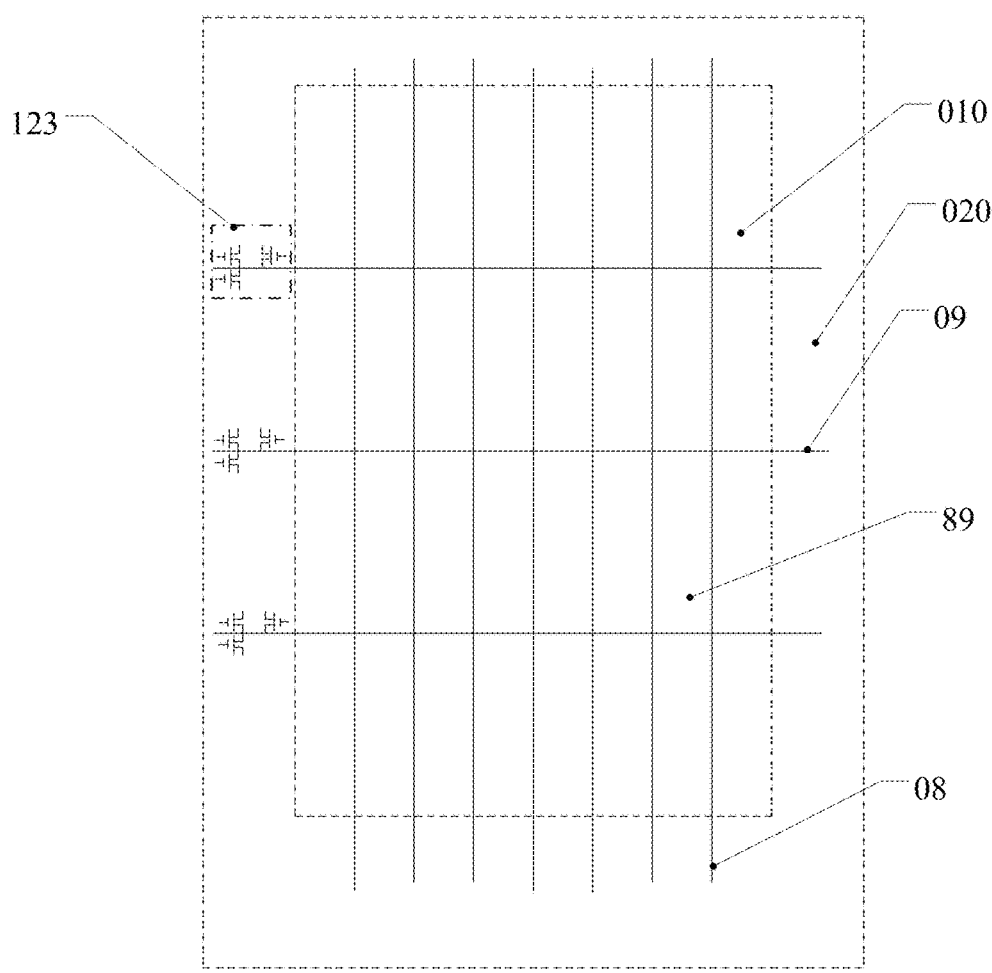
FIG. 1b is a schematic diagram of an array substrate and an array substrate circuit provided by an embodiment of the present disclosure.

For example, as illustrated in FIG. 1b, an array substrate includes a display region 010 and a peripheral region 020 provided on at least one side of the display region, the display region includes a plurality of data lines 08 and a plurality of gate lines 09, the plurality of data lines 08 and the plurality of gate lines 09 are intersected with and insulated from each other, so as to define a plurality of pixel regions (sub-pixels) 89, each pixel region 89 is further provided therein with a thin film transistor, and on and off of the thin film transistor within respective pixel regions is controlled by controlling a signal on the data line 08 and the gate line 09, so as to control on and off of the sub-pixel. The first signal line 10 can be the data line 08, the gate line 09, a clock signal line, and the like in the array substrate, which will not be limited here. The array substrate is, for example, a substrate constituting a liquid crystal display panel or an organic light-emitting diode display panel, which will not be limited here, as long as it includes a signal line ready for electrostatic discharge. As illustrated in FIG. 1b, the array substrate circuit 123 according to the present disclosure can be located within the peripheral region. In FIG. 1b, it is illustrated with a case where the array substrate circuit 123 provided by the embodiment of the present disclosure is provided on the gate line 09 as an example, but is not limited thereto.

For example, as illustrated in FIG. 1a, FIG. 2a, FIG. 2h, and FIG. 3 to FIG. 5, the electrostatic discharge circuit 20 further includes a second signal line 21 and a third signal line 22, the test circuit 30 further includes a test signal input line 31; and the test signal input line 31 is configured to input a signal to the third TFT 301. The first TFT 201 includes a first source electrode 2011 and a first drain electrode 2012. One of the first signal line 10 and the second signal line 21 is electrically connected with the first drain electrode 2012, and the other is electrically connected with the first source electrode 2011.

The second TFT 202 includes a second source electrode 2021 and a second drain electrode 2022. One of the first signal line 10 and the third signal line 22 is electrically connected with the second source electrode 2021, and the other is electrically connected with the second drain electrode 2022.

The third TFT 301 includes a third source electrode 3011 and a third drain electrode 3012, one of the first signal line 10 and the test signal input line 31 is electrically connected with the third source electrode 3011, and the other is electrically connected with the third drain electrode 3012; and the shared portion 23 includes: the first drain electrode 2012 or the first source electrode 2011 of the first TFT 201, which is shared as the third source electrode 3011 or the third drain electrode 3012 of the third TFT 301. That is, the first drain electrode 2012 or the first source electrode 2011 is just the shared portion 23, or, the third source electrode 3011 or the third drain electrode 3012 is just the shared portion 23. For example, a portion of the first signal line 10 is used as a portion of the first TFT 201, and also is used as a portion of the third TFT 301. Further, for example, a portion of the first signal line 10 is used as both the first drain electrode and the third source electrode; or, a portion of the first signal line 10 is used as both the first drain electrode and the third drain electrode. Similarly, a portion of the first signal line 10 is used as both the first source electrode and the third source electrode; or, a portion of the first signal line 10 is used as both the first source electrode and the third drain electrode. That is, a portion of the first signal line 10 is used as one of the first source electrode or the first drain electrode, and is also used as one of the third source electrode and the third drain electrode.

The first signal line can have a positive electrostatic charge or a negative electrostatic charge accumulated thereon. The electrostatic charge on the first signal line can be released to the second signal line through the first TFT or released to the third signal line through the second TFT. For example, the positive electrostatic charge accumulated on the first signal line is released through the first TFT and the second signal line, and the negative electrostatic charge accumulated on the first signal line is released through the second TFT and the third signal line; or, the negative electrostatic charge accumulated on the first signal line is released through the first TFT and the second signal line, and the positive electrostatic charge accumulated on the first signal line is released through the second TFT and the third signal line.

For example, in an array substrate circuit provided by an embodiment of the present disclosure, one of the second signal line 21 and the third signal line 22 is configured to apply a high-level signal and taken as a high-level signal line, and the other is configured to apply a low-level signal and taken as a low-level signal line. For example, in the embodiment of the present disclosure, the positive electrostatic charge accumulated on the first signal line is released through the high-level signal line, and the negative electrostatic charge accumulated on the first signal line is released through the low-level signal line. For example, when the electrostatic charge is released, the charge is led out by one TFT, e.g., the first TFT or the second TFT. For example, the electrostatic charge is released to the second signal line through the first TFT, or released to the third signal line through the second TFT. Of course, the second signal line and the third signal line can also be equal-level signal lines, which will not be limited by the embodiment of the present disclosure. For example, an electric potential on the second signal line and the third signal line is 0. This will not be limited by the embodiment of the present disclosure.

It should be noted that, in the embodiment of the present disclosure, a mode of electrical connection will not be limited. For example, it can be direct electrical connection, or electrical connection through a via hole, as long as the electrical connection can be achieved.

Hereinafter, several cases are illustrated; and it should be noted that, it is merely illustrative below, the embodiment of the present disclosure is not limited thereto, and other modes can also be used, which will not be limited here.

For example, as illustrated in FIG. 2a, FIG. 2h, and FIG. 3 to FIG. 5, in an array substrate circuit provided by an embodiment of the present disclosure, a first signal line 10 includes a first portion, a second signal line 21 includes a first portion, one of the first portion of the signal line 10 and the first portion of the second signal line 21 is used (shared or multiplexed) as a first drain electrode 2012 of the first TFT 201, and the other is used (shared or multiplexed) as a first source electrode 2011 of the first TFT 201. Thus, one of the first signal line 10 and the second signal line 21 can be formed integrally with the first drain electrode 2012 of the first TFT 201, and the other is formed integrally with the first source electrode 2011 of the first TFT 201, which can simplify a fabrication process. It should be noted that, a mode in which one of the first signal line 10 and the second signal line 21 is electrically connected with the first drain electrode 2012, and the other is electrically connected with the first source electrode 2011 is not limited thereto. For example, the electrical connection can also be achieved in other mode, e.g., through a via hole.

For example, as illustrated in FIG. 2a, FIG. 2h, and FIG. 3 to FIG. 5, in an array substrate circuit provided by an embodiment of the present disclosure, the first TFT 201 further includes a first gate electrode 2013, the first gate electrode 2013 is electrically connected with the first drain electrode 2012 of the first TFT 201; and the second TFT 202 further includes a second gate electrode 2023, and the second gate electrode 2023 is electrically connected with the second drain electrode 2022 of the second TFT 202. Thus, the first TFT and the second TFT can be respectively formed as diodes, so that a circuit layout design can be simplified. For example, the first drain electrode 2012 can be electrically connected with the first gate electrode 2013 through a via hole 57; the second drain electrode 2022 can be electrically connected with the second gate electrode 2023 through a via hole 58. Of course, the diodes can also not be formed, which will not be limited here.

For example, in an array substrate circuit provided by an embodiment of the present disclosure, at least one of the first TFT 201, the second TFT 202 and the third TFT 301 is a dual-gate-electrode TFT (a dual-gate TFT). By providing the dual-gate-electrode TFT, it is conducive to reducing a leakage current of the TFT in a normal operating state, so as to reduce poor display caused by signal crosstalk. Of course, the dual-gate-electrode TFT can also not be used, which will not be limited here.

For example, as illustrated in FIG. 2a, FIG. 2h, and FIG. 3 to FIG. 5, in an array substrate circuit provided by an embodiment of the present disclosure, a test signal input line 31 includes a first portion, the first portion of the test signal input line 31 is used (shared or multiplexed) as a third drain electrode 3012 or a third source electrode 3011 of the third TFT 301. Thus, the test signal input line 31 can be formed integrally with the third drain electrode 3012 or the third source electrode 3011, which can simplify a fabrication process. It should be noted that, a mode in which the test signal input line 31 is electrically connected with the third drain electrode 3012 or the third source electrode 3011 is not limited thereto. For example, the electrical connection can also be achieved in other mode, e.g., through a via hole.

For example, as illustrated in FIG. 2a, FIG. 2h, and FIG. 3 to FIG. 5, in an array substrate circuit provided by an embodiment of the present disclosure, a first signal line 10 includes a second portion, a third signal line 22 includes a first portion, one of the second portion of the first signal line 10 and the first portion of the third signal line 22 is used (shared or multiplexed) as a second source electrode 2021, and the other is used (shared or multiplexed) as a second drain electrode 2022. Thus, one of the first signal line 10 and the third signal line 22 can be formed integrally with the second source electrode 2021, and the other is formed integrally with the second drain electrode 2022, which thus can simplify a fabrication process. It should be noted that, a mode in which one of the first signal line 10 and the test signal input line 31 are electrically connected with the third source electrode 3011, and the other is electrically connected with the third drain electrode 3012 is not limited thereto. For example, the electrical connection can also be achieved in other mode, e.g., through a hole.

For example, as illustrated in FIG. 2a, FIG. 2h, and FIG. 3 to FIG. 5, in an array substrate circuit provided by an embodiment of the present disclosure, a test circuit 30 further includes a test signal control line 32, and the test signal control line 32 is configured to input a control signal, e.g., to input a gate electrode signal, to a third TFT 301. The test signal control line 32 includes a first portion, the third TFT 301 further includes a third gate electrode 3013, and the first portion of the test signal control line 32 is used (shared or multiplexed) as a third gate electrode 3013. Thus, the test signal control line 32 can be formed integrally with the third gate electrode 3013 of the third TFT 301, which can simplify a fabrication process. Of course, a mode in which the test signal control line 32 is electrically connected with the third gate electrode 3013 is not limited thereto; for example, the test signal control line 32 can be electrically connected with the third gate electrode 3013 through a via hole.

For example, the test signal control line 32 can be used for supplying a gate electrode voltage to the third TFT, and the test signal input line 31 can be used for inputting an electrical signal. In a case where the third TFT is turned on, a test function of the test circuit can be achieved.

Figure 2A:
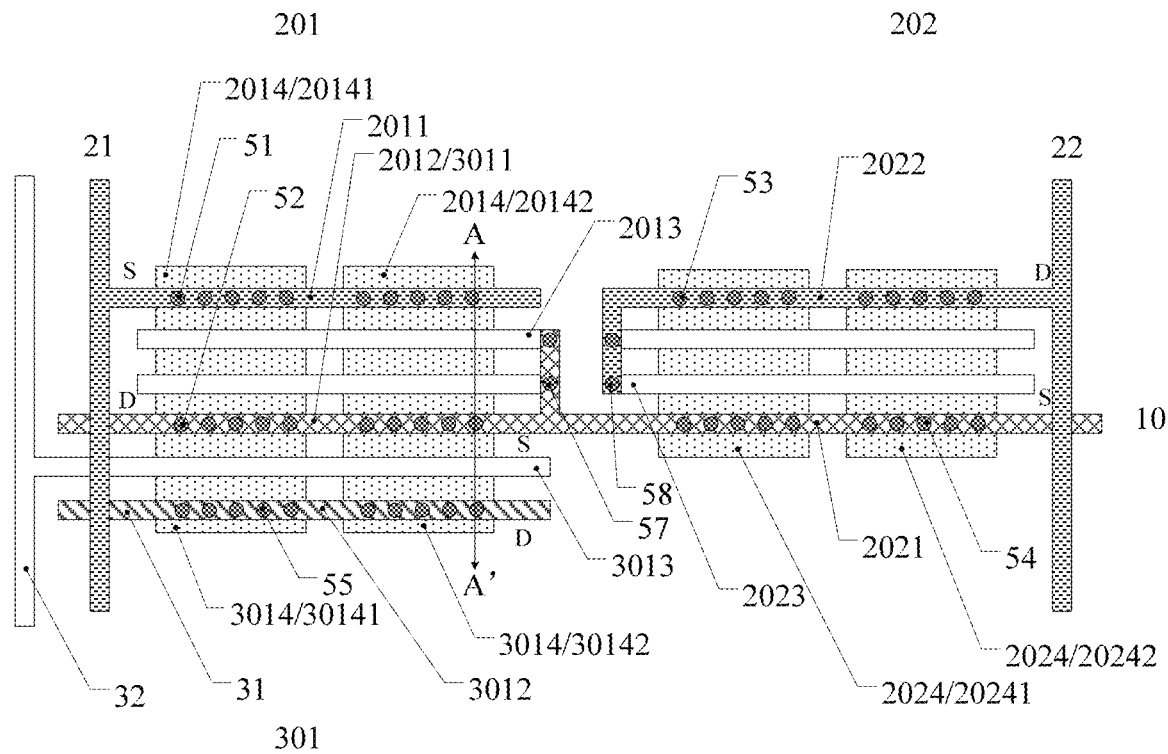
FIG. 2a is a plan schematic diagram of an array substrate circuit provided by an embodiment of the present disclosure.
Figure 2B:
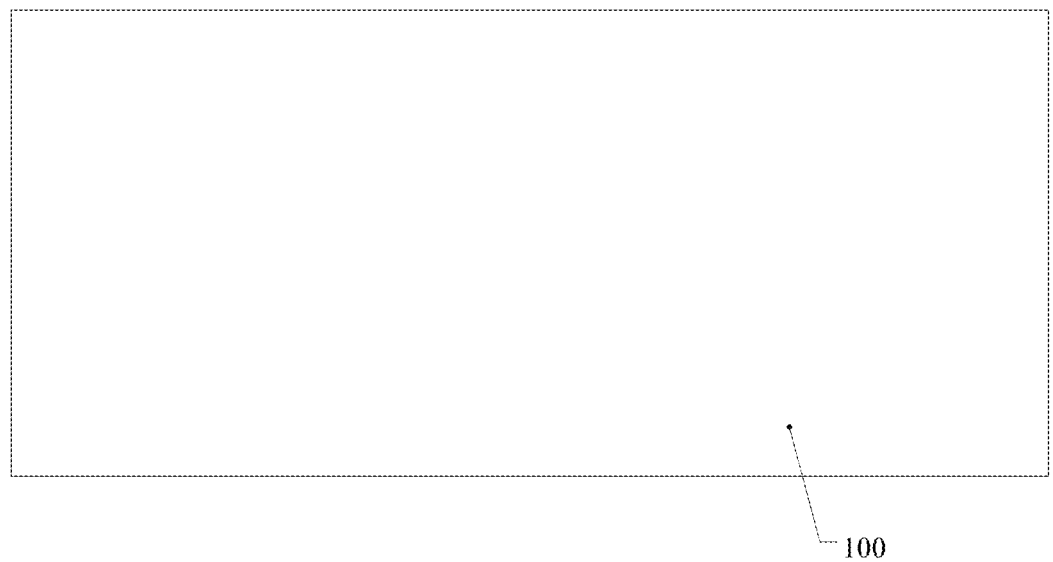
FIG. 2b is a schematic diagram of a first metal thin film for forming a first gate electrode, a second gate electrode and a third gate electrode in an array substrate circuit provided by an embodiment of the present disclosure.
Figure 2C:
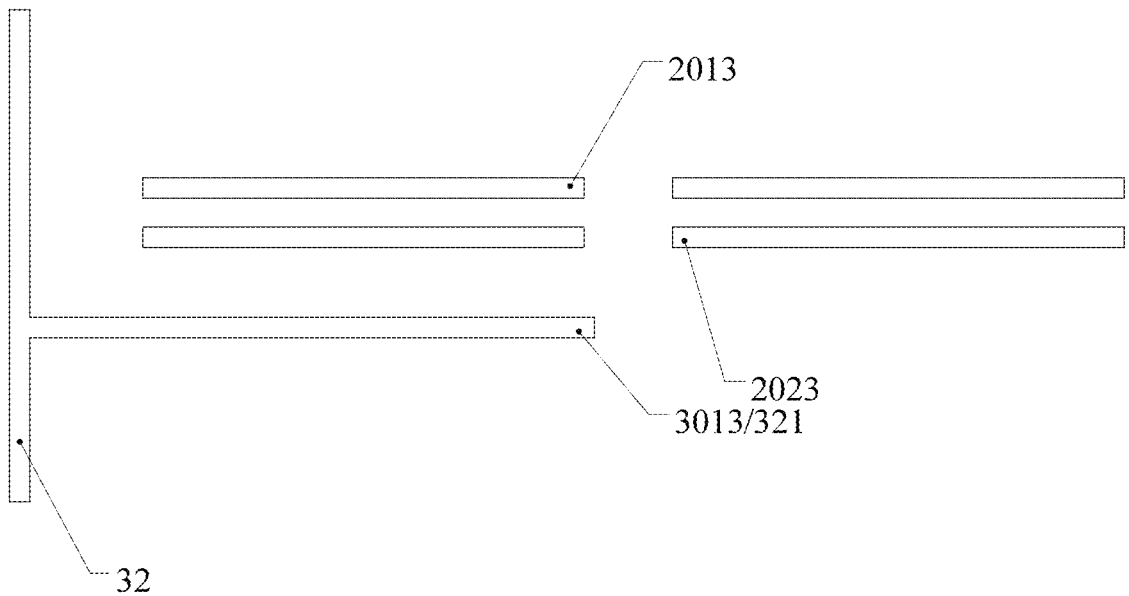
FIG. 2c is a schematic diagram of a first gate electrode, a second gate electrode and a third gate electrode formed from a first metal thin film, in an array substrate circuit provided by an embodiment of the present disclosure.

For example, as illustrated in FIG. 2c, in an array substrate circuit provided by an embodiment of the present disclosure, the first TFT 201 further includes a first gate electrode 2013, the second TFT 202 further includes a second gate electrode 2023, and the third TFT 301 further includes a third gate electrode 3013; the first gate electrode 2013, the second gate electrode 2023 and the third gate electrode 3013 can be formed from a first metal thin film 100 (as illustrated in FIG. 2b). For example, the first metal thin film 100 can be formed by a sputtering method, but is not limited thereto.

Figure 2D:
FIG. 2d is a schematic diagram of a second metal thin film for forming a first source electrode, a first drain electrode, a second source electrode, a second drain electrode, a third source electrode and a third drain electrode, in an array substrate circuit provided by an embodiment of the present disclosure.
Figure 2E:
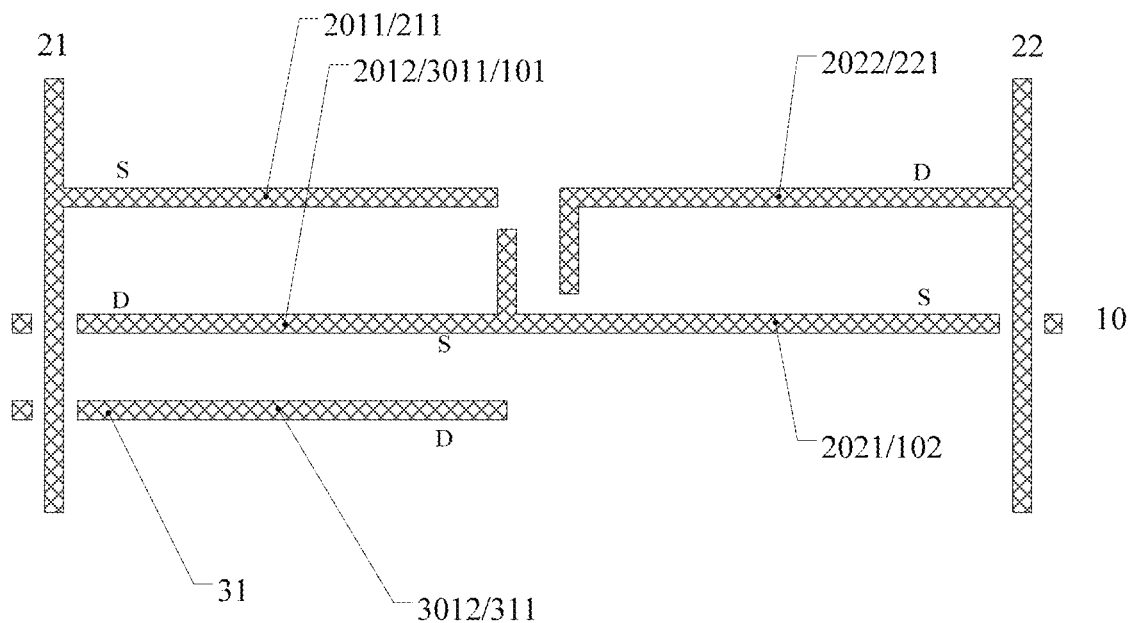
FIG. 2e is a schematic diagram of a first source electrode, a first drain electrode, a second source electrode, a second drain electrode, a third source electrode and a third drain electrode formed from a second metal thin film, in an array substrate circuit provided by an embodiment of the present disclosure.

For example, as illustrated in FIG. 2e, in an array substrate circuit provided by an embodiment of the present disclosure, the first source electrode 2011, the first drain electrode 2012, the second source electrode 2021, the second drain electrode 2022, the third source electrode 3011 and the third drain electrode 3012 can be formed from a second metal thin film 200 (as illustrated in FIG. 2d). For example, the second metal thin film 200 can be formed by a sputtering method, but is not limited thereto.

For example, as illustrated in FIG. 2e, in an array substrate circuit provided by an embodiment of the present disclosure, the first signal line 10, the second signal line 21 and the third signal line 22 include portions provided in a same layer, and the portions of the first signal line 10, the second signal line 21 and the third signal line 22 provided in the same layer can be formed from a second metal thin film 200.

It should be noted that, in the embodiment of the present disclosure, if there is an intersecting portion among the first signal line, the second signal line, the third signal line and other signal lines, one of the signal lines can be disconnected at the intersection, a connection portion can be provided in other conductive layer, and both ends of the connection portion can be electrically connected with both ends of the disconnected signal lines through an insulating layer via hole.

For example, in an array substrate circuit provided by an embodiment of the present disclosure, the first TFT 201 further includes a first active layer 2014, the second TFT 202 further includes a second active layer 2024, and the third TFT 301 further includes a third active layer 3014, the first source electrode 2011 and the first drain electrode 2012 are respectively electrically connected with the first active layer 2014 through via holes; the second source electrode 2021 and the second drain electrode 2022 are respectively electrically connected with the second active layer 2024 through via holes; and the third source electrode 3011 and the third drain electrode 3012 are respectively electrically connected with the third active layer 3014 through via holes.

For example, in an array substrate circuit provided by an embodiment of the present disclosure, the first TFT 201 and the third TFT 301 share different portions of a same active layer.

For example, as illustrated in FIG. 2a, FIG. 2h, and FIG. 3 to FIG. 5, in an array substrate circuit provided by an embodiment of the present disclosure, at least one of the first active layer 2014, the second active layer 2024 and the third active layer 3014 includes at least two separated sub-active layers. With the separated sub-active layers, thin film transistors with a larger width to length ratio (W/L) in parallel can be formed, which is conducive to transmitting a larger current at the time of occurrence of electrostatic discharge, and at the same time, reducing non-uniformity for forming a pattern of a larger width (W).

For example, in an array substrate circuit provided by an embodiment of the present disclosure, the first TFT 201 is an N-type TFT or a P-type TFT, the second TFT 202 is an N-type TFT or a P-type TFT, and the third TFT 301 is an N-type TFT or a P-type TFT. For example, the first TFT and the second TFT can both be N-type TFTs or P-type TFTs, and it can also be that, one is an N-type TFT and the other is a P-type TFT, which will not be limited here.

Hereinafter, it is illustrated with several specific embodiments. It should be noted that, in the respective embodiments below, in the N-type TFT, a source electrode is in a low level, a drain electrode is in a high level, and the N-type TFT can be switched on by a positive gate voltage (gate-source voltage difference is larger than 0). In the P-type TFT, the source electrode is in a high level, the drain electrode is in a low level, the P-type TFT can be switched on by negative gate voltage (gate-source voltage difference is less than 0). A gate electrode and the drain electrode are electrically connected to form a diode. It is illustrated with the above case as an example in the embodiments of the present disclosure, but is not limited thereto.

First Embodiment

This embodiment provides an array substrate circuit, as illustrated in FIG. 2a, including an electrostatic discharge circuit 20 for supplying electrostatic discharge to a first signal line 10 and a test circuit 30 for supplying a test signal to the first signal line 10, the electrostatic discharge circuit 20 including a first TFT 201 and a second TFT 202, and the test circuit 30 including a third TFT 301.

The electrostatic discharge circuit 20 further includes a second signal line 21 and a third signal line 22, and the test circuit 30 further includes a test signal input line 31.

The first TFT 201 includes a first source electrode 2011 and a first drain electrode 2012, the first signal line 10 is electrically connected with the first drain electrode 2012, and the second signal line 21 is electrically connected with the first source electrode 2011.

The second TFT 202 includes a second source electrode 2021 and a second drain electrode 2022, the first signal line 10 is electrically connected with the second source electrode 2021, and the third signal line 22 is electrically connected with the second drain electrode 2022.

The third TFT 301 includes a third source electrode 3011 and a third drain electrode 3012, the first signal line 10 is electrically connected with the third source electrode 3011, the test signal input line 31 is electrically connected with the third drain electrode 3012; and the first drain electrode 2012 of the first TFT 201 is shared as the third source electrode 3011 of the third TFT 301. It should be noted that, it can also be that the first signal line 10 is electrically connected with the third drain electrode 3012, the test signal input line 31 is electrically connected with the third source electrode 3011; and the first drain electrode 2012 of the first TFT 201 is shared as the third drain electrode 3012 of the third TFT 301.

The array substrate circuit provided by this embodiment is designed to be compact, which reduces a load of the signal line and reduces areas of the electrostatic discharge circuit and the test circuit, and is conducive to achieving a narrow frame.

The first signal line can have a positive electrostatic charge or a negative electrostatic charge accumulated thereon. The electrostatic charge accumulated on the first signal line is released to the second signal line through the first TFT or released to the third signal line through the second TFT. For example, the first signal line can be a data line, a gate line, a clock signal line, and the like, in the array substrate, which will not be limited here. The array substrate is, for example, a substrate constituting a liquid crystal display panel or an organic light-emitting diode display panel, which will not be limited here, as long as it includes a signal line whose static electricity is to be released.

For example, the second signal line 21 is configured to apply a high level signal and taken as a high-level signal line, and the third signal line 22 is configured to apply a low-level signal and taken as a low-level signal line. The positive electrostatic charge accumulated on the first signal line is released through the high-level signal line, and the negative electrostatic charge accumulated on the first signal line is released through the low-level signal line.

For example, in an array substrate circuit provided by an example of this embodiment, a continuous high-level signal can be applied to the second signal line 21, and a continuous low-level signal can be applied to the third signal line 22, but is not limited thereto.

For example, the first TFT 201 is an N-type TFT, the second TFT 202 is an N-type TFT, and the third TFT 301 is an N-type TFT or a P-type TFT.

Hereinafter, several cases will be illustrated, and it should be noted that, it is mere illustration below, this embodiment is not limited thereto, and other modes can also be used, which will not be limited here.

For example, as illustrated in FIG. 2a, in an array substrate circuit provided by an example of this embodiment, the first TFT 201 further includes a first gate electrode 2013, the first gate electrode 2013 is electrically connected with the first drain electrode 2012 of the first TFT 201; the second TFT 202 further includes a second gate electrode 2023, the second gate electrode 2023 is electrically connected with the second drain electrode 2022 of the second TFT 202. Thus, the first TFT and the second TFT can be respectively formed as diodes, so that a circuit layout design can be simplified.

For example, as illustrated in FIG. 2a, in an array substrate circuit provided by an example of this embodiment, the first TFT 201 and the third TFT 301 share different portions of a same active layer. In this case, the types of the first TFT and the third TFT can be the same, for example, the same as the N-type TFT, or the same as the P-type TFT. Thus, the fabrication process can be simplified.

For example, as illustrated in FIG. 2a, in an array substrate circuit provided by an example of this embodiment, the first TFT 201 further includes a first active layer 2014, the second TFT 202 further includes a second active layer 2024, and the third TFT 301 further includes a third active layer 3014; the first source electrode 2011 and the first drain electrode 2012 are respectively electrically connected with the first active layer 2014 through via holes 51, 52; the second source electrode 2021 and the second drain electrode 2022 are respectively electrically connected with the second active layer 2024 through via holes 53, 54; and the third source electrode 3011 and the third drain electrode 3012 are respectively electrically connected with the third active layer 3014 through via holes 52, 55.

For example, as illustrated in FIG. 2a, in an array substrate circuit provided by an example of this embodiment, at least one of the first active layer 2014, the second active layer 2024 and the third active layer 3014 includes at least two separated sub-active layers. For example, the first active layer 2014 includes sub-active layers 20141, 20142; the second active layer 2024 includes sub-active layers 20241, 20242; and the third active layer 3014 includes sub-active layers 30141, 30142. With the two separated sub-active layers, thin film transistors with a larger width to length ratio (W/L) in parallel can be formed, which is conducive to transmitting a larger current at the time of occurrence of electrostatic discharge, and at a same time, reducing non-uniformity for forming a pattern of a larger width (W).

For example, as illustrated in FIG. 2b and FIG. 2c, in an array substrate circuit provided by an example of this embodiment, the first gate electrode 2013, the second gate electrode 2023 and the third gate electrode 3013 are formed from a first metal thin film 100. For example, a first metal thin film 100 as illustrated in FIG. 2b is formed firstly, and a pattern as illustrated in FIG. 2c is formed by a patterning process, the pattern includes the first gate electrode 2013, the second gate electrode 2023 and the third gate electrode 3013. In a case where the first portion 321 of the test signal control line 32 is used as the third gate electrode 3013 of the third TFT 301, the pattern includes the first gate electrode 2013, the second gate electrode 2023 and the test signal control line 32.

For example, as illustrated in FIG. 2d and FIG. 2e, in an array substrate circuit provided by an example of this embodiment, the first source electrode 2011, the first drain electrode 2012, the second source electrode 2021, the second drain electrode 2022, the third source electrode 3011 and the third drain electrode 3012 are formed from the second metal thin film 200. For example, a second metal thin film 200 as illustrated in FIG. 2d is formed firstly, and a pattern as illustrated in FIG. 2e is formed by a patterning process, the pattern includes the first source electrode 2011 and the first drain electrode 2012 of the first TFT 201, the second source electrode 2021 and the second drain electrode 2022 of the second TFT 202, the third source electrode 3011 and the third drain electrode 3012 of the third TFT 301.

For example, as illustrated in FIG. 2a and FIG. 2c, in an array substrate circuit provided by an example of this embodiment, the test circuit 30 further includes a test signal control line 32, the third TFT 301 further includes the third gate electrode 3013, a first portion 321 (with reference to FIG. 2c) of the test signal control line 32 is used as the third gate electrode 3013 of the third TFT 301, so that the test signal control line 32 can be formed integrally with the third gate electrode 3013.

For example, as illustrated in FIG. 2e, in an array substrate circuit provided by an example of this embodiment, a first portion 311 of the test signal input line 31 is used as the third drain electrode 3012 or the third source electrode 3011 of the third TFT 301. Thus, the test signal input line 31 can be formed integrally with the third drain electrode 3012 or the third source electrode 3011 of the third TFT 301, which can simplify a fabrication process.

For example, as illustrated in FIG. 2e, in an array substrate circuit provided by an example of this embodiment, a first portion 101 of the first signal line 10 is used as the first drain electrode 2012 of the first TFT 201, a first portion 211 of the second signal line 21 is used as the first source electrode 2011 of the first TFT 201. Thus, the first signal line 10 can be formed integrally with the first drain electrode 2012 of the first TFT 201; and the second signal line 21 is integrally formed with the first source electrode 2011 of the first TFT 201, which can simplify the fabrication process.

For example, as illustrated in FIG. 2e, in an array substrate circuit provided by an example of this embodiment, a second portion 102 of the first signal line 10 is used as the second source electrode 2021 of the second TFT 202, and a first portion 221 of the third signal line 22 is used as the second drain electrode 2022 of the second TFT 202. Thus, the first signal line 10 can be formed integrally with the second source electrode 2021 of the second TFT 202, and the third signal line 22 is integrally formed with the second drain electrode 2022 of the second TFT 202, which can simplify the fabrication process.

For example, as illustrated in FIG. 2e, in an array substrate circuit provided by an example of this embodiment, the first signal line 10, the second signal line 21 and the third signal line 22 include portions provided in a same layer (what is illustrated in FIG. 2e is just the portions provided in the same layer), and the portions of the first signal line 10, the second signal line 21 and the third signal line 22 provided in the same layer are also formed from the second metal thin film 200.

Figure 2F:
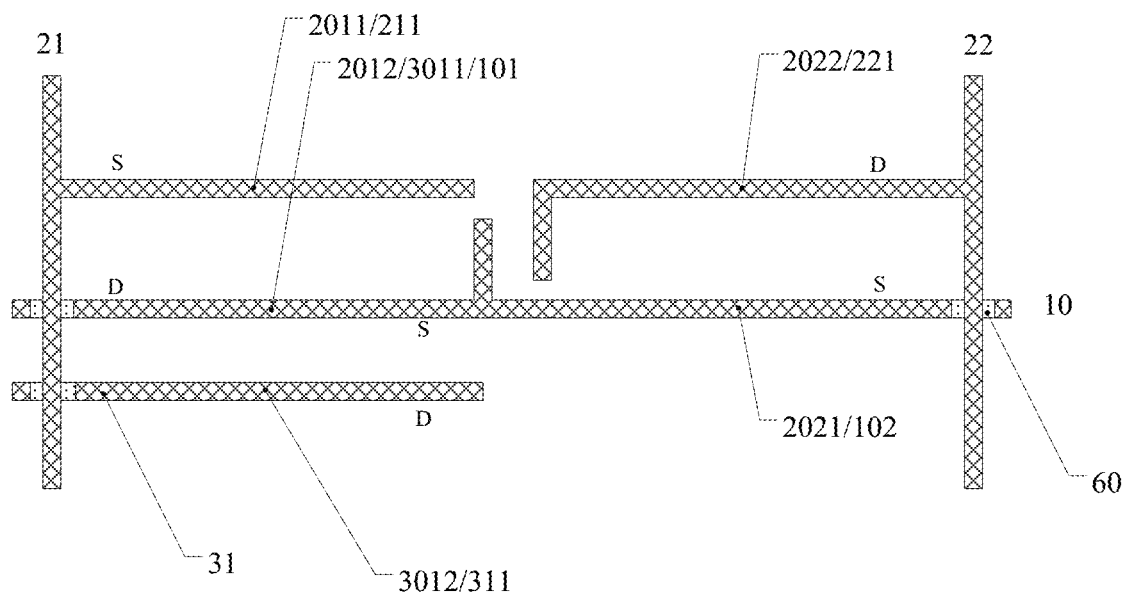
FIG. 2f is a schematic diagram of a connection portion for connecting a signal line which is disconnected at an intersection, in an array substrate circuit provided by an embodiment of the present disclosure.

It should be noted that, as illustrated in FIG. 2f, in the embodiment of the present disclosure, if there is an intersecting portion among the first signal line, the second signal line, the third signal line and other signal lines, one of the signal lines can be disconnected at the intersection, a connection portion 60 can be provided in other conductive layer, and both ends of the connection portion 60 can be electrically connected with both ends of the disconnected signal lines through an insulating layer via hole. For example, the connection portion 60 can be formed from the first metal thin film 100. That is, the connection portion 60, the first gate electrode 2013, the second gate electrode 2023 and the third gate electrode 3013 are formed in a same layer, and in a case where the first portion 321 of the test signal control line 32 is used as the third gate electrode 3013 of the third TFT 301, the connection portion 60, the first gate electrode 2013, the second gate electrode 2023 and the test signal control line 32 are formed in a same layer.

For example, in an array substrate circuit provided by an example of this embodiment, at least one of the first TFT 201, the second TFT 202 and the third TFT 301 is a dual-gate-electrode TFT. The dual-gate-electrode TFT is employed to reduce a leakage current of the TFT in a normal operating state, so as to reduce poor display caused by signal crosstalk. Of course, the dual-gate-electrode TFT can also be not used, which is not be limited here.

Figure 2G:
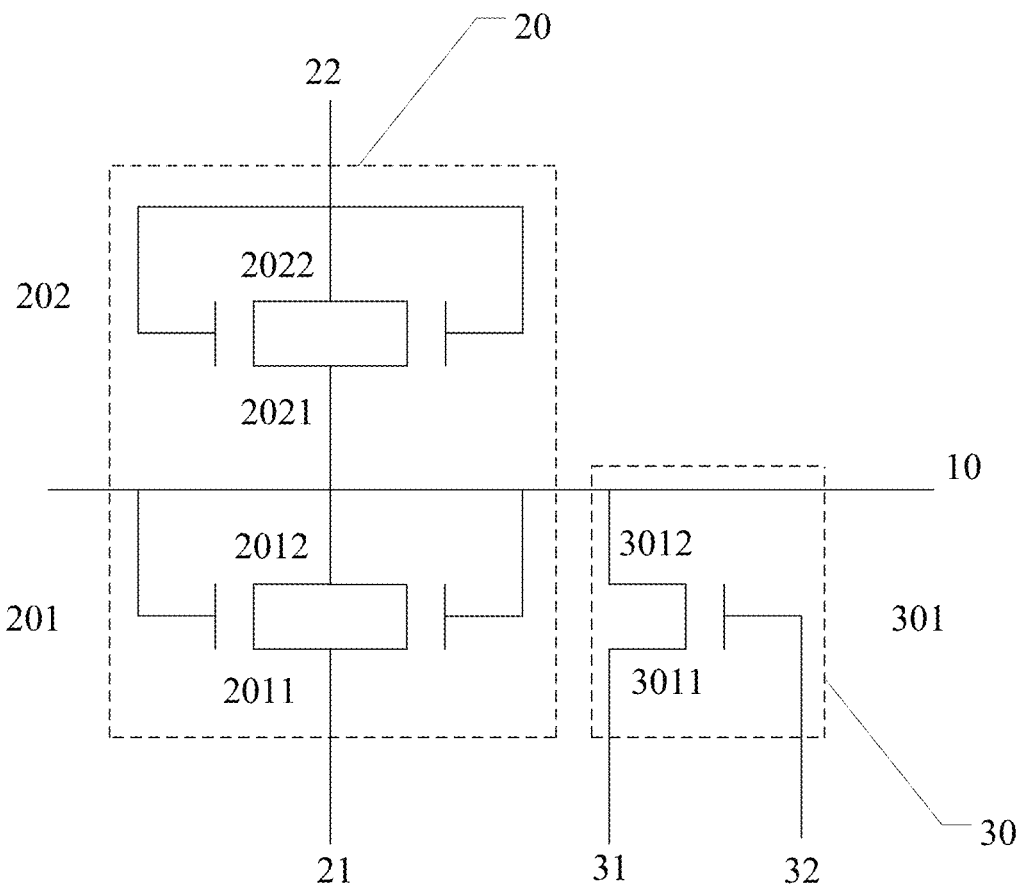
FIG. 2g is a structural schematic diagram of an array substrate circuit (equivalent circuit) provided by an embodiment of the present disclosure.
Figure 2H:
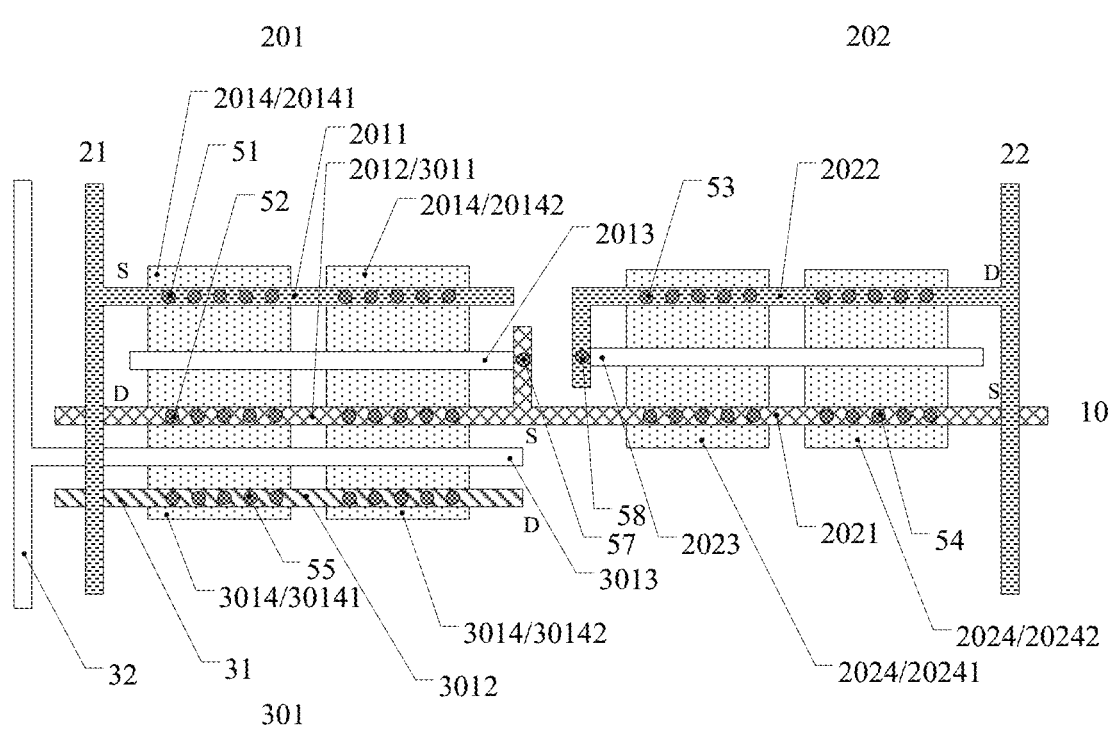
FIG. 2h is a plan schematic diagram of another array substrate circuit provided by an embodiment of the present disclosure.
Figure 2I:
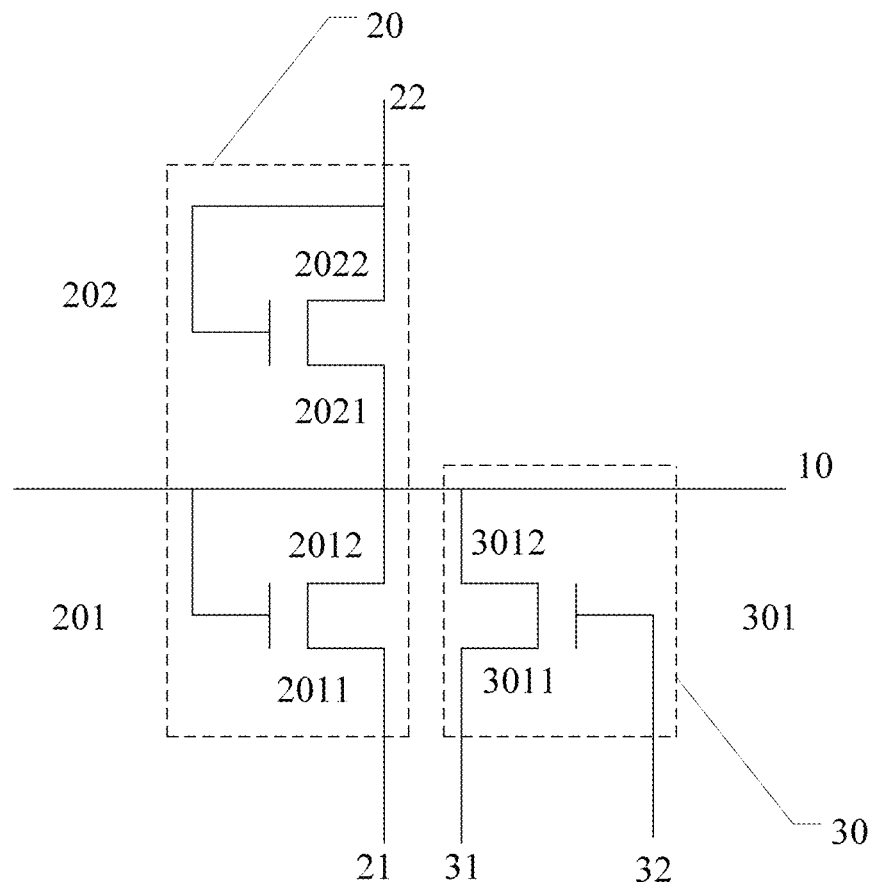
FIG. 2i is a structural schematic diagram of another array substrate circuit (equivalent circuit) provided by an embodiment of the present disclosure.

For example, in an array substrate circuit provided by an example of this embodiment, in a case where the first TFT 201 and the second TFT 202 are the dual-gate-electrode TFTs, and a diode connection is formed, a circuit structural schematic diagram is illustrated in FIG. 2g. In a case where none of the first TFT 201, the second TFT 202, and the third TFT 301 is dual-gate-electrode TFT, and the first TFT 201 and the second TFT 202 form a diode connection, a plan schematic diagram is illustrated in FIG. 2h, and a circuit structural schematic diagram is illustrated in FIG. 2i.

For example, in one example of this embodiment, an array substrate includes a display region and a peripheral region located outside the display region, and a peripheral circuit of the array substrate can be provided within the peripheral region. For example, the peripheral region can be located on at least one side of the display region, or the peripheral region can be provided around the display region. For example, a TFT and a pixel electrode electrically connected with a drain electrode of the TFT, etc., can also be provided within the display region, which will not be described in detail here.

For example, this embodiment further provides a fabrication method of an array substrate circuit, the method including following steps.

(1) Forming a buffer layer 002 on a base substrate 001.

(2) Forming a semiconductor layer 003 on the buffer layer 002, the semiconductor layer 003 including a pattern of a first active layer 2014, a second active layer 2024 and a third active layer 3014.

(3) Forming a gate electrode insulating layer 004 on the semiconductor layer 003.

(4) Forming a pattern of a connection portion 60, a first gate electrode 2013, a second gate electrode 2023 and a third gate electrode 3013 on the gate electrode insulating layer 004; and in a case where a first portion of a test signal control line 32 is used as the third gate electrode, forming a pattern of the first gate electrode 2013, the second gate electrode 2023 and the test signal control line 32 on the gate electrode insulating layer.

(5) Forming an interlayer insulating layer.

(6) Forming via holes in the gate electrode insulating layer 004 and the interlayer insulating layer.

(7) Forming a pattern of portions of a first source electrode 2011, a first drain electrode 2012, a second source electrode 2021, a second drain electrode 2022, a third source electrode 3011, a third drain electrode 3012, a first signal line, a second signal line, and a third signal provided on a same layer; wherein, the first source electrode 2011 and the first drain electrode 2012 are respectively electrically connected with the first active layer 2014 through via holes, the second source electrode 2021 and the second drain electrode 2022 are respectively electrically connected with the second active layer 2024 through via holes, the third source electrode 3011 and the third drain electrode 3012 are respectively electrically connected with the third active layer 3014 through via holes, and the portions where the first signal line, the second signal line and the third signal line are disconnected are respectively electrically connected with the connection portions 60 at corresponding positions through via holes (as illustrated in FIG. 2e and FIG. 2f).

Figure 2J:
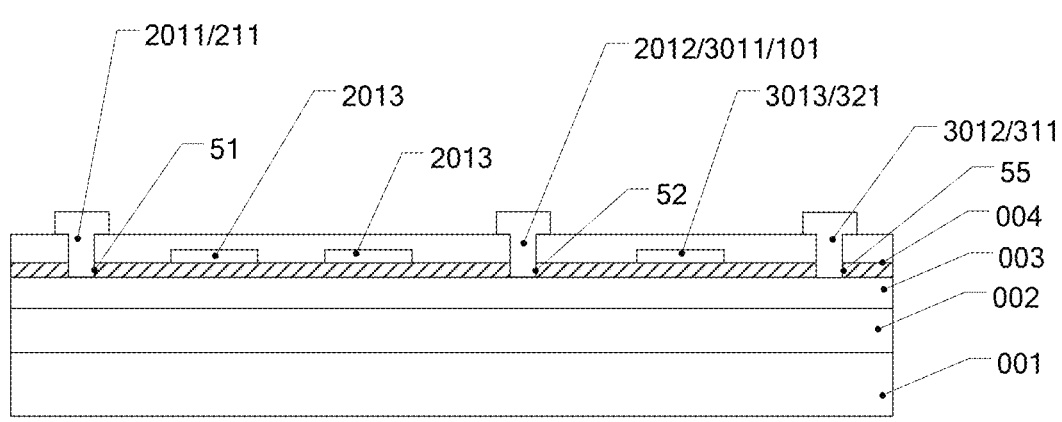
FIG. 2j is a cross-sectional schematic diagram (for example, a cross-sectional view in an A-A' direction in FIG. 2a) of an array substrate circuit provided by an embodiment of the present disclosure.
Figure 2K:
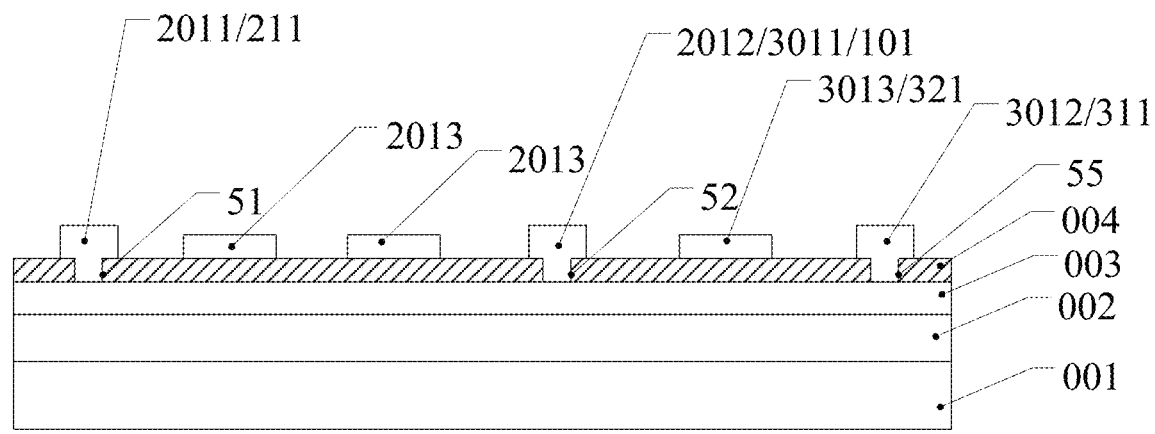
FIG. 2k is cross-sectional schematic diagram (for example, a cross-sectional view in an A-A' direction in FIG. 2a) of another array substrate circuit provided by an embodiment of the present disclosure.

In another example, as illustrated in FIG. 2k, the first source electrode 2011, the first drain electrode 2012, the second source electrode 2021, the second drain electrode 2022, the third source electrode 3011, the third drain electrode 3012, the first gate electrode 2013, the second gate electrode 2023 and the third gate electrode 3013 can be formed in a same layer.

For example, a cross-sectional view of an array substrate circuit provided by an example of this embodiment is illustrated in FIG. 2j and FIG. 2k. It should be noted that, FIG. 2j and FIG. 2k are merely illustrative and not limitative, and an array substrate circuit of other structure can also be formed. For example, the gate electrode can also be formed prior to the semiconductor layer.

For example, the buffer layer includes silicon nitride, silicon oxide, or a dual-layer thin film of silicon oxide and silicon nitride.

For example, a semiconductor layer material includes amorphous silicon (a-Si), polysilicon (p-Si), a metal oxide semiconductor material, and the like; p-Si includes low temperature polysilicon; and the metal oxide semiconductor includes ZnO, IGO, IGZO, and the like.

For example, the gate electrode insulating layer includes silicon nitride and silicon oxide, and can be a single-layer structure or a multi-layer structure of, e.g., silicon oxide/silicon nitride.

For example, the interlayer insulating layer can be made of an inorganic substance, e.g., silicon nitride, and can also be made of an organic substance, e.g., a resin.

For example, the first gate electrode, the second gate electrode, the third gate electrode, the first source electrode, the first drain electrode, the second source electrode, the second drain electrode, the third source electrode, the third drain electrode, the first signal line, the second signal line and the third signal line can all be prepared by metal materials, e.g., Cu, Al, Mo, Ti, Cr, W, and the like, and can also be made of alloy of these materials; they can be a single-layer structure or a multi-layer structure of, e.g., Mo\Al\Mo, Ti\Al\Ti, Ti\Cu\Ti, Mo\Cu\Ti, and the like.

For example, the buffer layer and the gate electrode insulating layer can be formed by using a plasma enhanced chemical vapor deposition (PECVD) method.

It should be noted that, the above description of the material of respective elements/components of the array substrate circuit is merely illustrative and is not limitative, and other suitable materials can also be used, which will not be limited here. The preparation method of the array substrate circuit according to the present disclosure is not limited to the above-described method given.

Second Embodiment

This embodiment provides an array substrate circuit. The differences between this embodiment and the first embodiment are that, the first TFT 201 is a P-type TFT, the second TFT 202 is a P-type TFT; the second signal line 21 is configured to apply a low-level signal and taken as a low-level signal line, and the third signal line 22 is configured to apply a high-level signal and taken as a high-level signal line. The remaining can refer to the description in the first embodiment.

Third Embodiment

Figure 3:
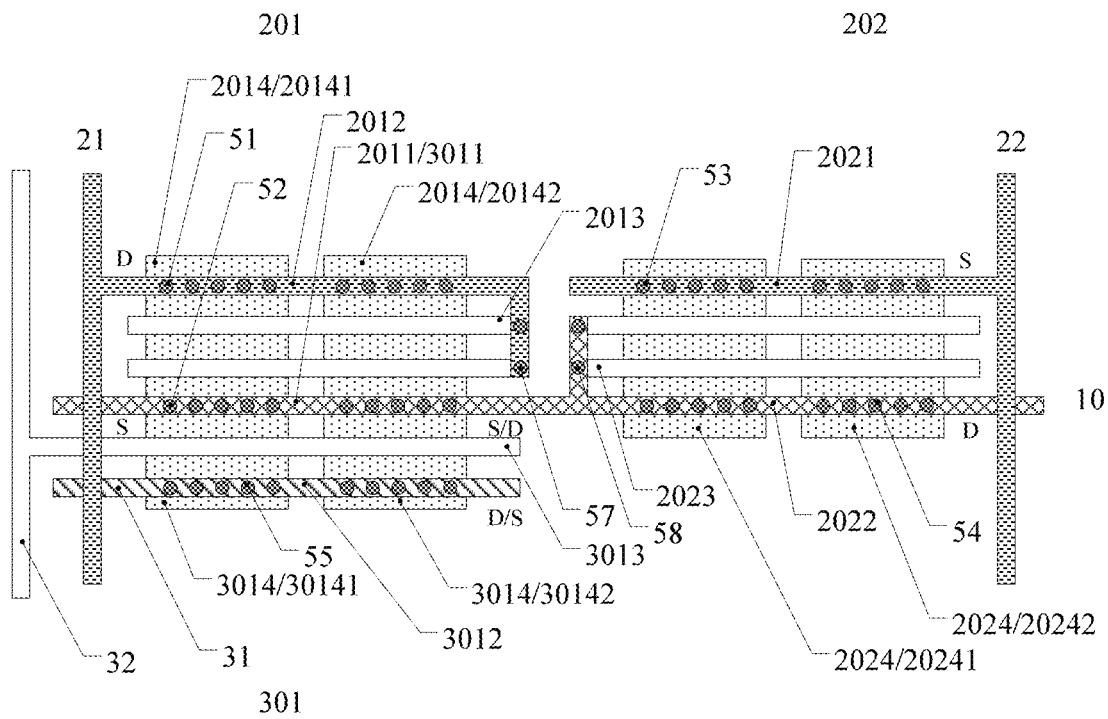
FIG. 3 is a plan schematic diagram of an array substrate circuit provided by another embodiment of the present disclosure.

This embodiment provides an array substrate circuit, which, as illustrated in FIG. 3, is different from the array substrate circuit in the first embodiment as follows.

(1) The first TFT 201 is a P-type TFT, and the second TFT 202 is a P-type TFT.

(2) The first source electrode according to the first embodiment is the first drain electrode according to this embodiment, the first drain electrode according to the first embodiment is the first source electrode according to this embodiment, the second source electrode according to the first embodiment is the second drain electrode according to this embodiment, and the second drain electrode according to the first embodiment is a second source electrode according to this embodiment.

The remaining can refer to the description in the first embodiment. It should be noted that, the second signal line 21 is still configured to apply a high-level signal and taken as a high-level signal line, and the third signal line 22 is still configured to apply a low-level signal and taken as a low-level signal line.

Fourth Embodiment

This embodiment provides an array substrate circuit. The differences between this embodiment and the third embodiment are that, the first TFT 201 is an N-type TFT, the second TFT 202 is an N-type TFT; the second signal line 21 is configured to apply a low-level signal and taken as a low-level signal line, and the third signal line 22 is configured to apply a high-level signal and taken as a high-level signal line. The remaining can refer to the description in the third embodiment.

Fifth Embodiment

Figure 4:
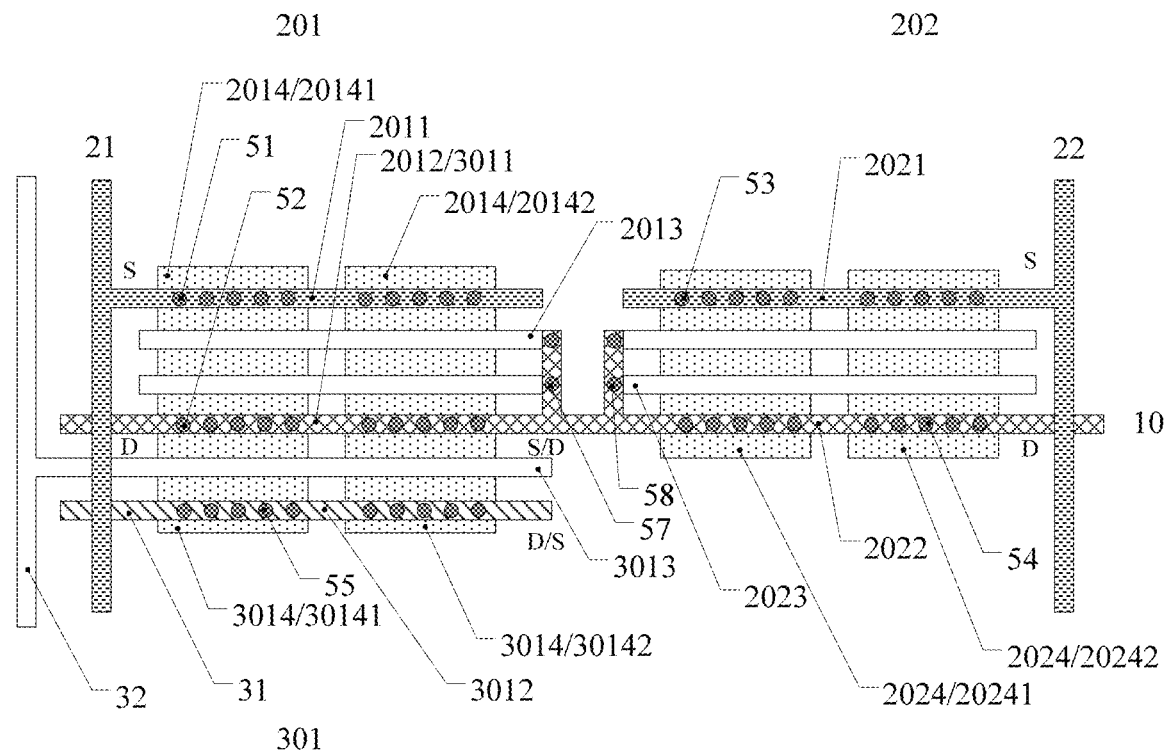
FIG. 4 is a plan schematic diagram of an array substrate circuit provided by another embodiment of the present disclosure.

This embodiment provides an array substrate circuit, which, as illustrated in FIG. 4, is different from the array substrate circuit in the first embodiment as follows.

(1) The second TFT 202 is a P-type TFT.

(2) The second source electrode according to the first embodiment is the second drain electrode according to this embodiment, and the second drain electrode according to the first embodiment is the second source electrode according to this embodiment.

For the rest, description of the first embodiment can be referred to. For example, the first TFT 201 is still an N-type TFT, the second signal line 21 is still configured to apply a high-level signal and taken as a high-level signal line, and the third signal line 22 is still configured to apply a low-level signal and taken as a low-level signal line.

Sixth Embodiment

This embodiment provides an array substrate circuit. The differences between this embodiment and the fifth embodiment are that, the first TFT 201 is a P-type TFT, the second TFT 202 is an N-type TFT; the second signal line 21 is configured to apply a low-level signal and taken as a low-level signal line, and the third signal line 22 is configured to apply a high-level signal and taken as a high-level signal line. For the rest, description of the fifth embodiment can be referred to.

Seventh Embodiment

Figure 5:
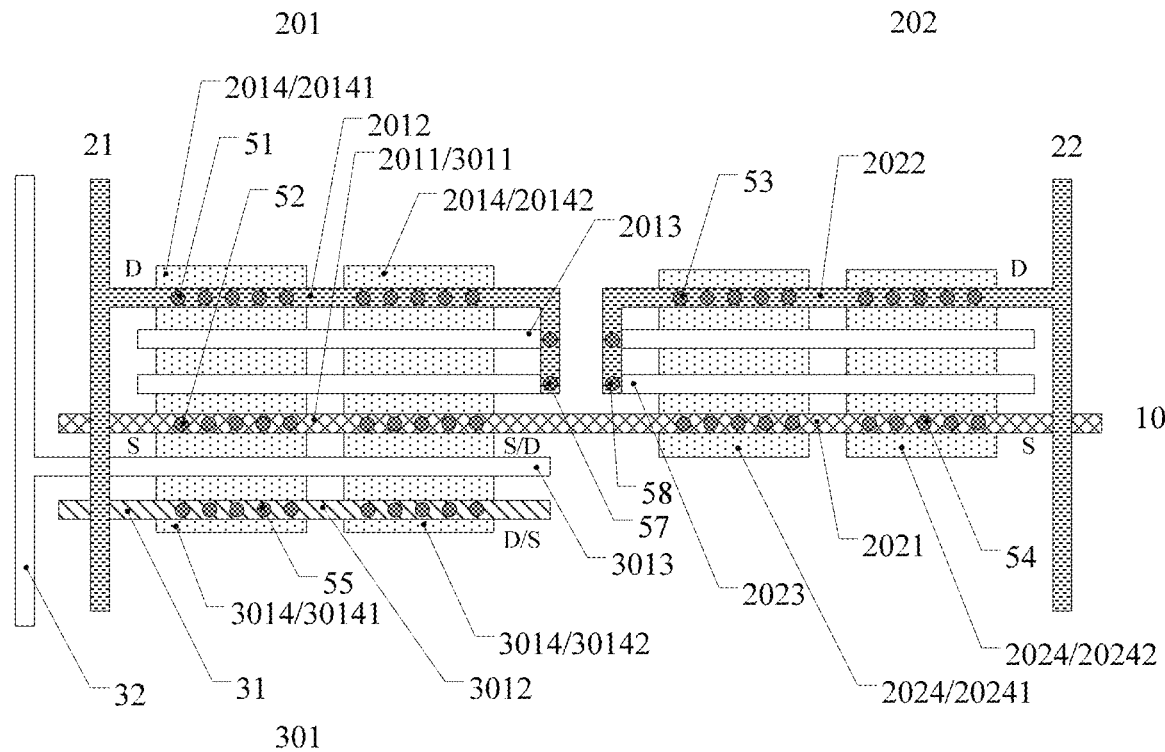
FIG. 5 is a plan schematic diagram of an array substrate circuit provided by another embodiment of the present disclosure.

This embodiment provides an array substrate circuit, which, as illustrated in FIG. 5, is different from the array substrate circuit in the first embodiment as follows.

(1) The first TFT 201 is a P-type TFT.

(2) The first source electrode according to the first embodiment is the first drain electrode according to this embodiment, and the first drain electrode according to the first embodiment is a first source electrode according to this embodiment.

For the rest, description of the first embodiment can be referred to. It should be noted that, the second TFT 202 is still an N-type TFT, the second signal line 21 is still configured to apply a high-level signal and taken as a high-level signal line, and the third signal line 22 is still configured to apply a low-level signal and taken as a low-level signal line.

Eighth Embodiment

This embodiment provides an array substrate circuit. The differences between this embodiment and the first embodiment are that, the first TFT 201 is an N-type TFT, the second TFT 202 is a P-type TFT; the second signal line 21 is configured to apply a low-level signal and taken as a low-level signal line, and the third signal line 22 is configured to apply a high-level signal and taken as a high-level signal line. For the rest, description of the seventh embodiment can be referred to.

The followings statements should be noted.

(1) In the embodiments of present disclosure, a patterning to form a pattern or a patterning process can only include a photolithography process, or include a photolithography process and an etching process, or include other processes to form a preset pattern such as a printing process, and an inkjet process, no limitation will be given here. A patterning process can only include a photolithography process, or include a photolithography process and an etching process, or include other processes to form a preset pattern such as a printing process, and an inkjet process, no limitation will be given here. A photolithography process includes forming a pattern by processes such as film forming, exposure, and development etc., by using photoresist, mask, exposure machine etc.

(2) In the embodiments of the present disclosure, the "same layer" refers to forming a film layer configured to form a predetermined pattern by the same film forming process, and forming a layer structure with the same mask by one patterning process. According to differences of the predetermined pattern, the one patterning process can include multiple exposure, development, or etching process, and the predetermined pattern in the layer structure can be continuous and can be discontinuous, the predetermined pattern can also be in different heights or have different thicknesses.

(3) The accompanying drawings involve only the structure(s) in connection with the embodiment(s) of the present disclosure, and other structure(s) can be referred to common design(s).

(4) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(5) In case of no conflict, features in one embodiment or in different embodiments can be combined.

(6) Unless otherwise defined, the same reference numeral denotes the same element/component.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

This application claims the benefit of priority from Chinese patent application No. 201620363217.3, filed on Apr. 26, 2016, the disclosure of which is incorporated herein in its entirety by reference as a part of the present application.

What is claimed is:

1. An array substrate circuit, comprising:
    an electrostatic discharge circuit for supplying electrostatic discharge to a first signal line; and
    a test circuit for supplying a test signal to the first signal line,
    wherein the electrostatic discharge circuit and the test circuit have a shared portion,
    wherein the electrostatic discharge circuit comprises a first thin film transistor (TFT) and a second TFT, the test circuit comprises a third TFT,
    wherein the first TFT and the third TFT have the shared portion, or the second TFT and the third TFT have the shared portion,
    wherein the electrostatic discharge circuit further comprises a second signal line and a third signal line, and the test circuit further comprises a test signal input line;
    the first TFT comprises a first source electrode and a first drain electrode, one of the first signal line and the second signal line is electrically connected with the first drain electrode, and the other is electrically connected with the first source electrode;
    the second TFT comprises a second source electrode and a second drain electrode, one of the first signal line and the third signal line is electrically connected with the second source electrode, and the other is electrically connected with the second drain electrode;
    the third TFT comprises a third source electrode and a third drain electrode, one of the first signal line and the test signal input line is electrically connected with the third source electrode, and the other is electrically connected with the third drain electrode; and
    the shared portion comprises: the first drain electrode or the first source electrode of the first TFT, which is shared as the third source electrode or the third drain electrode of the third TFT.

2. The array substrate circuit according to claim 1, wherein one of the second signal line and the third signal line is configured to apply a high-level signal, and the other is configured to apply a low-level signal.

3. The array substrate circuit according to claim 1, wherein the second signal line and the third signal line are configured to apply an equal-level signal.

4. The array substrate circuit according to claim 1, wherein the first TFT and the second signal line are configured to release a positive electrostatic charge accumulated on the first signal line, the second TFT and the third signal line are configured to release a negative electrostatic charge accumulated on the first signal line; or
    the first TFT and the second signal line are configured to release a negative electrostatic charge accumulated on the first signal line, and the second TFT and the third signal line are configured to release a positive electrostatic charge accumulated on the first signal line.

5. The array substrate circuit according to claim 1, wherein one of a first portion of the first signal line and a first portion of the second signal line is shared as the first drain electrode of the first TFT, and the other is shared as the first source electrode of the first TFT.

6. The array substrate circuit according to claim 1, wherein the first TFT further comprises a first gate electrode, the first gate electrode is electrically connected with the first drain electrode or the first source electrode of the first TFT; and the second TFT further comprises a second gate electrode, the second gate electrode is electrically connected with the second drain electrode or the second source electrode of the second TFT.

7. The array substrate circuit according to claim 1, wherein at least one of the first TFT, the second TFT, and the third TFT is a dual-gate-electrode TFT.

8. The array substrate circuit according to claim 1, wherein the test signal input line comprises a first portion, and the first portion of the test signal input line is shared as the third drain electrode or the third source electrode of the third TFT.

9. The array substrate circuit according to claim 1, wherein one of a second portion of the first signal line and a first portion of the third signal line is shared as the second source electrode of the second TFT, and the other is shared as the second drain electrode of the second TFT.

10. The array substrate circuit according to claim 1, wherein the test circuit further comprises a test signal control line, the third TFT further comprises a third gate electrode, and a first portion of the test signal control line is shared as the third gate electrode of the third TFT.

11. The array substrate circuit according to claim 1, wherein the first TFT further comprises a first gate electrode, the second TFT further comprises a second gate electrode, the third TFT further comprises a third gate electrode, and wherein the first gate electrode, the second gate electrode, and the third gate electrode are formed from a same metal thin film.

12. The array substrate circuit according to claim 1, wherein the first source electrode, the first drain electrode, the second source electrode, the second drain electrode, the third source electrode, and the third drain electrode are formed from a same metal thin film.

13. The array substrate circuit according to claim 12, wherein the first signal line, the second signal line, and the third signal line comprise portions provided in a same layer, and the portions of the first signal line, the second signal line, and the third signal line provided in the same layer are formed from a same metal thin film.

14. The array substrate circuit according to claim 1, wherein the first TFT and the third TFT share different portions of a same active layer.

15. The array substrate circuit according to claim 1, wherein the first TFT further comprises a first active layer, the second TFT further comprises a second active layer, the third TFT further comprises a third active layer, and at least one of the first active layer, the second active layer, and the third active layer comprises at least two separated sub-active layers.

16. The array substrate circuit according to claim 1, wherein the first signal line comprises a data line or a gate line.

17. An array substrate, comprising the array substrate circuit according to claim 1.

18. A display device, comprising the array substrate according to claim 17.

* * * * *